(12) United States Patent
Sato

(10) Patent No.: US 9,294,076 B2
(45) Date of Patent: Mar. 22, 2016

(54) SWITCHING POWER SUPPLY DEVICE AND PULSE WIDTH MODULATION CIRCUIT USED THEREIN

(75) Inventor: Terukazu Sato, Oita (JP)

(73) Assignee: OITA UNIVERSITY, Oita (JP)

(*) Notice: Subject to any disclaimer, the term of this patent is extended or adjusted under 35 U.S.C. 154(b) by 0 days.

(21) Appl. No.: 14/372,241

(22) PCT Filed: Jul. 19, 2012

(86) PCT No.: PCT/JP2012/068365
§ 371 (c)(1),
(2), (4) Date: Jul. 15, 2014

(87) PCT Pub. No.: WO2013/108429
PCT Pub. Date: Jul. 25, 2013

(65) Prior Publication Data
US 2015/0022165 A1    Jan. 22, 2015

(30) Foreign Application Priority Data

Jan. 20, 2012  (JP) .................................. 2012-009979
Jul. 18, 2012  (JP) .................................. 2012-159236

(51) Int. Cl.
*H02M 3/156* (2006.01)
*H03K 3/017* (2006.01)
*H02M 3/158* (2006.01)
*H02M 1/00* (2007.01)

(52) U.S. Cl.
CPC .............. *H03K 3/017* (2013.01); *H02M 3/156* (2013.01); *H02M 3/158* (2013.01); *H02M 2001/0025* (2013.01)

(58) Field of Classification Search
CPC ..... H02M 3/145; H02M 3/155; H02M 3/156; H02M 3/1582; H02M 1/08; H02M 1/084; H02M 2001/0003; H02M 2001/0029; H02M 2001/0025
See application file for complete search history.

(56) References Cited

U.S. PATENT DOCUMENTS

| | | | | |
|---|---|---|---|---|
| 8,860,393 | B2* | 10/2014 | Kronmueller ........... | G05F 1/595 323/283 |
| 8,866,462 | B2* | 10/2014 | Luo ....................... | H02M 3/158 323/283 |
| 2011/0221412 | A1* | 9/2011 | Li et al. ........................ | 323/283 |

FOREIGN PATENT DOCUMENTS

| | | |
|---|---|---|
| JP | 2001-339953 | 12/2001 |
| JP | 2003-33027 | 1/2003 |
| JP | 2009-33883 | 2/2009 |

OTHER PUBLICATIONS

Constant Frequency Hysteretic PWM Controlled Buck Converter, K. Taniguchi et al., The Technical Report of the Institute of Electronics, Information and Communication Engineers, Oct. 2009, vol. 109, No. 216, EE2009, pp. 7-11.

(Continued)

*Primary Examiner* — Harry Behm

(57) ABSTRACT

A problem of the present invention is to provide a switching power supply device and a pulse width modulation circuit capable of operating stably in synchronization with a clock signal. To solve the problem, a pulse width modulation circuit 3A in a switching power supply device 1A includes square-wave voltage output means 8A for, when an integrated voltage $V_n$ rises to an upper threshold voltage or more, shifting a square-wave voltage $V_{PWM}$ to L level, or when the voltage $V_n$ drops to a lower threshold voltage or less, shifting the voltage $V_{PWM}$ to H level, and clock means 6A for outputting a first clock signal $V_{CL1}$ and a second clock signal $V_{CL2}$, which are 180° out of phase from each other. The square-wave voltage output means 8A is adapted to: (1) if the clock signal $V_{CL1}$ changes while the voltage $V_n$ is dropping, shift the voltage $V_{PWM}$ to H level even when the voltage $V_n$ has not yet reached the lower threshold voltage; and (2) if the clock signal $V_{CL2}$ changes while the voltage $V_n$ is rising, shift the voltage $V_{PWM}$ to L level even when the voltage $V_n$ has not yet reached the upper threshold voltage.

7 Claims, 12 Drawing Sheets

(56) References Cited

OTHER PUBLICATIONS

Constant Frequency Ripple Regulator without Sub harmonic Oscillation, S. Hirose et al., IEICE Technical Report, The Institute of Electronics, Information and Communication Engineers, Jul. 2011, EE2011-6 to EE2011-17.

Constant Frequency Ripple Regulator Free from Sub-harmonic Oscillation, S. Hirose et al., IEEE PEDS 2011, Dec. 2011, pp. 543-548.

* cited by examiner (A)

(B)

Prior Art

Prior Art

SWITCHING POWER SUPPLY DEVICE AND PULSE WIDTH MODULATION CIRCUIT USED THEREIN

TECHNICAL FIELD

The present invention relates to a switching power supply device mainly used in multiphase power supply equipment, as well as a pulse width modulation circuit used in the switching power supply device to control a converter portion.

BACKGROUND ART

Recent years have seen widespread use of multiphase power supply equipment consisting of a plurality of switching power supply devices connected in parallel so as to be driven out of phase from one another. Power supply equipment of such a configuration is advantageously capable of outputting high current in proportion to the number of phases, i.e., the number of switching converters used.

As a switching power supply device used in multiphase power supply equipment, for example, a switching power supply device 100 shown in FIG. 11 is known (see, for example, Non-Patent Document 1). In the switching power supply device 100, as shown in the figure, a converter portion 2, which is a step-down DC-DC converter, steps down an input voltage $V_i$ outputted by a direct-current power supply 30 and outputs an output voltage $v_o$, which is equal to a preset target voltage $V_r$, to a load 31, and in addition to the converter portion 2, the switching power supply device 100 includes a pulse width modulation circuit 101 for generating a square-wave voltage $V_{PWM}$ to drive switching elements included in the converter portion 2.

The pulse width modulation circuit 101 includes an error amplifier portion 102 for outputting an error voltage $v_c$ between the output voltage $v_o$ and the target voltage $V_r$, a comparator portion 103 provided with a comparator 16 having a positive input terminal to which the error voltage $v_c$ is inputted via a first resistor 15 and a negative input terminal to which an integrated voltage $v_n$, which is obtained by integrating a square-wave voltage $V_{PWM}$ outputted from an output terminal, is inputted, the output terminal being connected to the positive input terminal via a second resistor 17, and a clock portion 104 for applying a clock signal $V_{CL}$ to the positive input terminal of the comparator 16.

In the switching power supply device 100, when the voltage $v_p$ at the positive input terminal is lower than the integrated voltage $v_n$, the voltage $v_p$ at the positive input terminal is forcibly raised to H level in accordance with a change of the clock signal $V_{CL}$, as shown in FIGS. 12(A) and 12(B). That is, in the switching power supply device 100, the square-wave voltage $V_{PWM}$ changes in synchronization with the clock signal $V_{CL}$.

In general, self-oscillating switching power supply devices have an issue in that due to operating frequency fluctuations in accordance with load fluctuations, there is difficulty in phase synchronization in a multiphase configuration achieved by connecting a plurality of switching power supply devices in parallel. In this regard, in the case of the switching power supply device 100, this issue can be solved by inputting the same clock signal $V_{CL}$ to each of the phases, i.e., the switching power supply devices 100 connected in parallel.

PRIOR ART DOCUMENT

Non-Patent Document

Non-Patent Document 1: K. Taniguchi, T. Sato, T. Nabeshima and K. Nishijima, "Constant Frequency Hysteretic PWM Controller for Buck Converter", The Technical Report of The Institute of Electronics, Information and communication Engineers, October, 2009, Vol. 109, No. 216, EE2009, pp. 7-11.

DISCLOSURE OF THE INVENTION

Problems to be Solved by the Invention

However, the conventional switching power supply device 100 shown in FIG. 11 has an issue in that when the duty cycle D of the square-wave voltage $V_{PWM}$ exceeds 50% during the cycle T of the clock signal $V_{CL}$, subharmonic oscillation occurs, so that the square-wave voltage $V_{PWM}$ becomes unstable, as shown in FIG. 12(C). Accordingly, in the case of the conventional switching power supply device 100, it is necessary to select circuit constants such that the duty cycle D does not exceed 50% under any circumstances, which is burdensome for the designer.

The present invention has been achieved under the above circumstances, with a problem thereof being to provide a switching power supply device and a pulse width modulation circuit capable of operating stably in synchronization with a clock signal even when the duty cycle D exceeds 50%.

Solution to the Problems

To solve the problem, the present invention provides a pulse width modulation circuit for generating a square-wave voltage taking two states at L and H levels to drive switching elements included in a converter portion, the circuit including square-wave voltage output means for shifting the square-wave voltage to L level when an integrated voltage obtained by integrating the square-wave voltage rises to an upper threshold voltage or more, or shifting the square-wave voltage to H level when the integrated voltage drops to a lower threshold voltage or less, and clock means for outputting a first clock signal and a second clock signal to the square-wave voltage output means, the first clock signal and the second clock signal being 180° out of phase from each other, the square-wave voltage output means being adapted to: (1) when the first clock signal changes while the integrated voltage is dropping, shift the square-wave voltage to H level even if the integrated voltage has not yet reached the lower threshold voltage; and (2) when the second clock signal changes while the integrated voltage is rising, shift the square-wave voltage to L level even if the integrated voltage has not yet reached the upper threshold voltage.

In a specific configuration example, the square-wave voltage output means may include an error amplifier portion for outputting an error voltage between a preset target voltage and an output voltage of the converter portion, and a comparator portion including a comparator with a positive input terminal to which the error voltage is inputted via a first resistor and a negative input terminal to which an integrated voltage obtained by integrating the square-wave voltage outputted from its output terminal is inputted, the output terminal being connected to the positive input terminal via a second resistor.

In this case, the clock means may be configured to include a first diode having an anode to which the first clock signal is applied and a cathode connected to a line on which the first resistor is disposed, and a second diode having a cathode to which the second clock signal is applied and an anode connected to the line on which the first resistor is disposed, or the clock means may be configured to include a first diode having an anode to which the first clock signal is applied and a cathode connected to a line on which the second resistor is disposed, and a second diode having a cathode to which the second clock signal is applied and an anode connected to the line on which the second resistor is disposed.

In another specific configuration example, the square-wave voltage output means may include an error amplifier portion for outputting an error voltage between a preset target voltage and an output voltage of the converter portion, a logic circuit portion for outputting the square-wave voltage, and a comparator portion including a comparator with an output terminal connected to an input of the logic circuit portion, a positive input terminal to which the error voltage is inputted via a third resistor, and a negative input terminal to which an integrated voltage obtained by integrating the square-wave voltage is inputted, the square-wave voltage being inputted to the positive input terminal via a fourth resistor.

In this case, the logic circuit portion may be specifically configured to include, for example, first and second logical operation portions of a dual-input type, such that the first logical operation portion receives an output from the comparator portion and one of the first and second clock signals, the second logical operation portion receives an output from the first logical operation portion and the other of the first and second clock signals, and the second logical operation portion outputs the square-wave voltage.

Furthermore, to solve the problem, the present invention also provides a switching power supply device, wherein switching elements included in a converter portion are driven by a square-wave voltage outputted by the pulse width modulation circuit.

Herein, the "changes of clock signals (i.e., first and second clock signals)" include continuous upward pulsing changes repeated in order such as "L level→H level→L level", and continuous downward pulsing changes repeated in order such as "H level→L level→H level". It should be noted that the "changes of clock signals" herein do not encompass simple, stepped changes, either "L level→H level" or "H level→L level".

Furthermore, in the present invention, the first clock signal and the second clock signal are 180° out of phase from each other, and this means that there is a difference of T/2 between a pulsing change of the first clock signal every cycle T and a pulsing change of the second clock signal every cycle T.

Effect of the Invention

The present invention makes it possible to provide a switching power supply device and a pulse width modulation circuit capable of operating stably in synchronization with a clock signal even when the duty cycle D exceeds 50%.

MODE FOR CARRYING OUT THE INVENTION

First Embodiment

First, a switching power supply device and a pulse width modulation circuit according to a first embodiment of the present invention will be described with reference to FIGS. 1 to 7. Note that parenthesized characters in FIG. 1 denote circuit constants, e.g., the resistance value of a resistor 18 is $R_1$ [Ω], and the capacitance of a capacitor 19 is $C_1$ [F].

Figure 1:
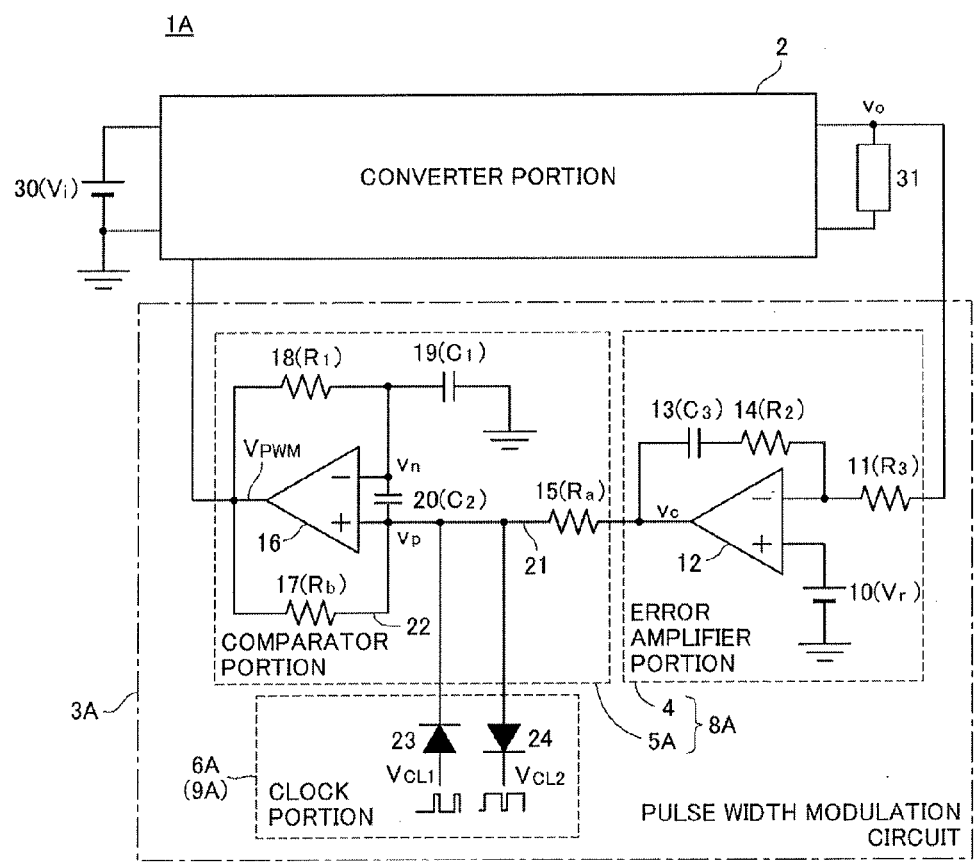
FIG. 1 is a circuit diagram of a switching power supply device according to a first embodiment of the present invention.

In the switching power supply device 1A according to the first embodiment of the present invention, as shown in FIG. 1, a converter portion 2, which is a step-down DC-DC converter, steps down an input voltage $V_i$ outputted by a direct-current power supply 30, and outputs an output voltage $v_o$, which is equal to a preset target voltage $V_r$, to a load 31, and in addition to the converter portion 2, the switching power supply device 1A includes a pulse width modulation circuit 3A for generating a square-wave voltage $V_{PWM}$ to drive switching elements included in the converter portion 2.

In the present invention, the circuit configuration of the converter portion 2 is not specifically limited, and any switching converter can be used so long as the input voltage $V_i$ can be converted into the output voltage $v_o$ by driving two or more switching elements (e.g., MOSFETs) by the square-wave voltage $V_{PWM}$ to be described later (ON/OFF control).

The pulse width modulation circuit 3A according to the present embodiment includes an error amplifier portion 4, a comparator portion 5A, and a clock portion 6A. Among these, the error amplifier portion 4 and the comparator portion 5A correspond to the "square-wave voltage output means" 8A of the present invention. Moreover, the clock portion 6A corresponds to the "clock means" 9A of the present invention.

The error amplifier portion 4 outputs an error voltage $v_c$ between the output voltage $v_o$ of the converter portion 2 and a target voltage $V_r$ outputted by a reference power supply 10, and the error amplifier portion 4 has an operational amplifier 12 as a main component. The operational amplifier 12 has a non-inverting input terminal (+) connected to the reference power supply 10, an inverting input terminal (−) connected to the output of the converter portion 2 via a resistor 11, and an output terminal from which the error voltage $v_c$ is outputted. The output terminal and the inverting input terminal are connected via a series circuit consisting of a capacitor 13 and a resistor 14.

The comparator portion 5A generates a square-wave voltage $V_{PWM}$ on the basis of the error voltage $v_c$ outputted by the error amplifier portion 4 and a clock signal outputted by the clock portion 6A, and outputs the square-wave voltage $V_{PWM}$ to the switching elements in the converter portion 2, and the comparator portion 5A has a comparator 16 with hysteresis as a main component. The comparator 16 includes a positive input terminal (+) connected to the output terminal of the operational amplifier 12 via a first resistor 15, an output terminal from which the square-wave voltage $V_{PWM}$ is outputted, and a negative input terminal (−) connected to the midpoint of an integrating circuit consisting of the resistor 18 connected to the output terminal and the capacitor 19. Moreover, the output terminal and the positive input terminal are connected via a second resistor 17, and a capacitor 20 is connected between the positive input terminal and the negative input terminal.

The integrating circuit consisting of the resistor 18 and the capacitor 19 integrates the square-wave voltage $V_{PWM}$, thereby generating an integrated voltage $v_n$ in a triangular waveform. The generated integrated voltage $v_n$ is inputted to the negative input terminal of the comparator 16.

The comparator 16 compares the voltage (integrated voltage $v_n$) at the negative input terminal and the voltage $v_p$ at the positive input terminal, and outputs an H-level square-wave voltage $V_{PWM}$ having a voltage value $V_{OH}$ when the voltage $v_p$ is higher. On the other hand, when the voltage $v_p$ is lower, the comparator 16 outputs an L-level square-wave voltage $V_{PWM}$ having a voltage value $V_{OL}$.

The clock portion 6A includes a first diode 23 having an anode to which a first clock signal $V_{CL1}$ is applied and a cathode connected to the positive input terminal of the comparator 16, a second diode 24 having a cathode to which a second clock signal $V_{CL2}$ is applied and an anode connected to the positive input terminal of the comparator 16, and an unillustrated clock signal generator. As shown in FIG. 2(A), the first clock signal $V_{CL1}$ becomes H level in cycles T, and the second clock signal $V_{CL2}$ becomes L level in cycles T. In other words, the first clock signal $V_{CL1}$ turns into an upward pulse in cycles T, and the second clock signal $V_{CL2}$ turns into a downward pulse in cycles T. Moreover, the first clock signal $V_{CL1}$ and the second clock signal $V_{CL2}$ are 180° out of phase from each other. The duration in which the first clock signal $V_{CL1}$ is at H level and the duration in which the second clock signal $V_{CL2}$ is at L level can be set arbitrarily, but it is preferable that they be sufficiently shorter than the cycle T.

For the first clock signal $V_{CL1}$ and the second clock signal $V_{CL2}$, the H level is set higher than the level of an upper threshold voltage $V_H$ of the comparator 16. Moreover, for the first clock signal $V_{CL1}$ and the second clock signal $V_{CL2}$, the L level is set lower than the level of a lower threshold voltage $V_L$ of the comparator 16. Where the resistance value of the first resistor 15 is $R_a$, and the resistance value of the second resistor 17 is $R_b$, the upper threshold voltage $V_H$ and the lower threshold voltage $V_L$ are represented by the following equations, respectively.

$$V_H = \frac{R_b}{R_a + R_b} v_c + \frac{R_a}{R_a + R_b} V_{OH} \quad \text{[Expression 1]}$$

$$V_L = \frac{R_b}{R_a + R_b} v_c + \frac{R_a}{R_a + R_b} V_{OL}$$

In the switching power supply device 1A according to the present embodiment, when the square-wave voltage $V_{PWM}$ is at L level, i.e., when the voltage $v_p$ at the positive input terminal of the comparator 16 is at L level, once the first clock signal $V_{CL1}$ rises to H level, the voltage $v_p$ is forcibly raised to H level, so that the square-wave voltage $V_{PWM}$ is raised to H level as well. On the other hand, when the square-wave voltage $V_{PWM}$ is at H level, i.e., when the voltage $v_p$ is at H level, once the second clock signal $V_{CL2}$ falls to L level, the voltage $v_p$ is forcibly lowered to L level, so that the square-wave voltage $V_{PWM}$ is lowered to L level as well.

Figure 2:
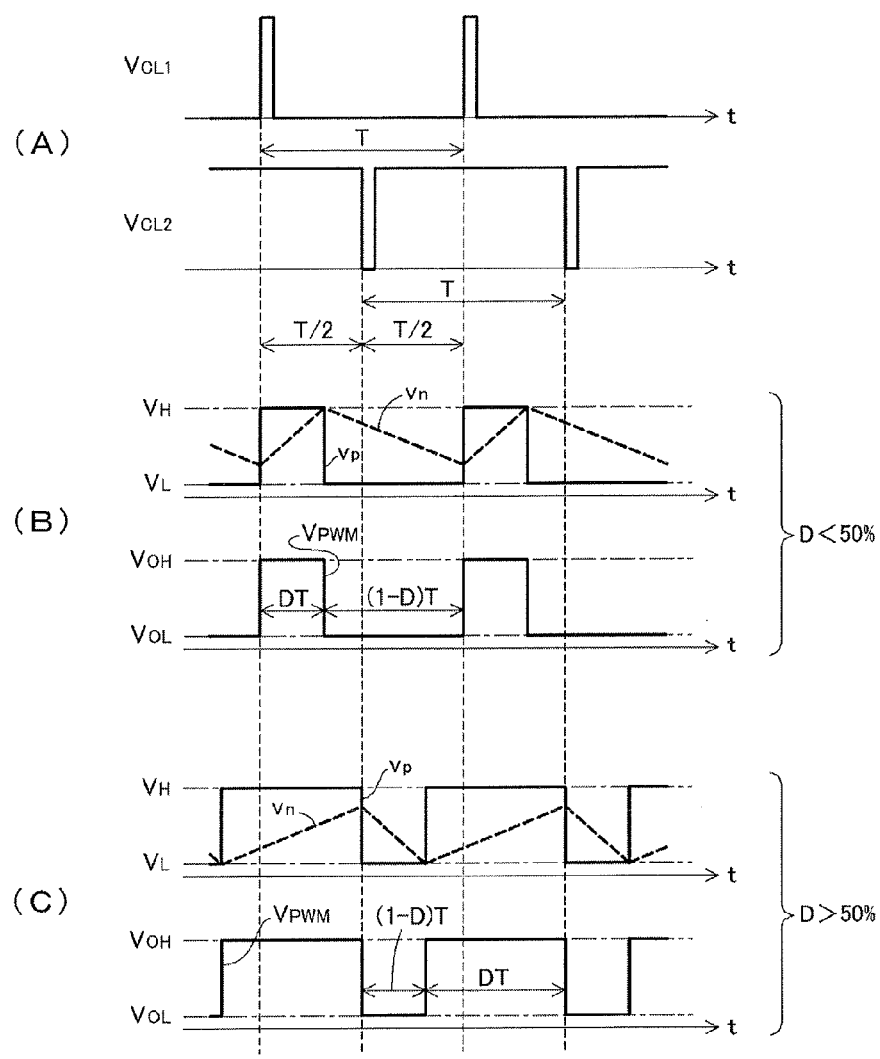
FIG. 2 provides operating waveform charts of the switching power supply device according to the first embodiment for (A) a first clock signal and a second clock signal, (B) a square-wave voltage where the duty cycle is below 50%, and (C) the square-wave voltage where the duty cycle exceeds 50%.

FIG. 2 provides operating waveform charts of the switching power supply device 1A. When the duty cycle D of the square-wave voltage $V_{PWM}$ is below 50% during the cycles T of the first clock signal $V_{CL1}$ and the second clock signal $V_{CL2}$, the switching power supply device 1A is synchronized with the first clock signal $V_{CL1}$ (see FIG. 2(B)). On the other hand, when the duty cycle D exceeds 50%, the switching power supply device 1A is synchronized with the second clock signal $V_{CL2}$ (see FIG. 2(C)).

More specifically, when the duty cycle D is below 50%, once the first clock signal $V_{CL1}$ rises to H level, both the voltage $v_p$ and the square-wave voltage $V_{PWM}$ are forcibly raised to H level, so that the integrated voltage $v_n$ starts to rise. Thereafter, once the integrated voltage $v_n$ slightly exceeds the upper threshold voltage $V_H$, so that the magnitude relationship between the voltage $v_p$ and the integrated voltage $v_n$ is inverted, the voltage $v_p$ and the square-wave voltage $V_{PWM}$ fall to L level, so that the integrated voltage $v_n$ starts to fall. Further, the voltage $v_p$ and the square-wave voltage $V_{PWM}$ are forcibly raised to H level the next time the first clock signal $V_{CL1}$ rises to H level, and the integrated voltage $v_n$ starts to rise again before it reaches the lower threshold voltage $V_L$.

Note that in the case where the duty cycle D is below 50%, no changes occur at the time the second clock signal $V_{CL2}$ falls to L level. This is because the voltage $v_p$ and the square-wave voltage $V_{PWM}$ have already been at L level.

On the other hand, in the case where the duty cycle D exceeds 50%, once the second clock signal $V_{CL2}$ falls to L level, the voltage $v_p$ and the square-wave voltage $V_{PWM}$ are forcibly lowered to L level, so that the integrated voltage $v_n$ starts to fall. Thereafter, when the integrated voltage $v_n$ becomes slightly lower than the lower threshold voltage $V_L$, so that the magnitude relationship between the voltage $v_p$ and the integrated voltage $v_n$ is inverted, both the voltage $v_p$ and the square-wave voltage $V_{PWM}$ are raised to H level, so that the integrated voltage $v_n$ starts to rise. Further, the voltage $v_p$ and the square-wave voltage $V_{PWM}$ are forcibly lowered to L level the next time the second clock signal $V_{CL2}$ falls to L level, and the integrated voltage $v_n$ starts to fall again before it reaches the upper threshold voltage $V_H$.

Note that in the case where the duty cycle D exceeds 50%, no changes occur at the time the first clock signal $V_{CL1}$ rises to H level. This is because the voltage $v_p$ and the square-wave voltage $V_{PWM}$ have already been at H level.

Figure 3:
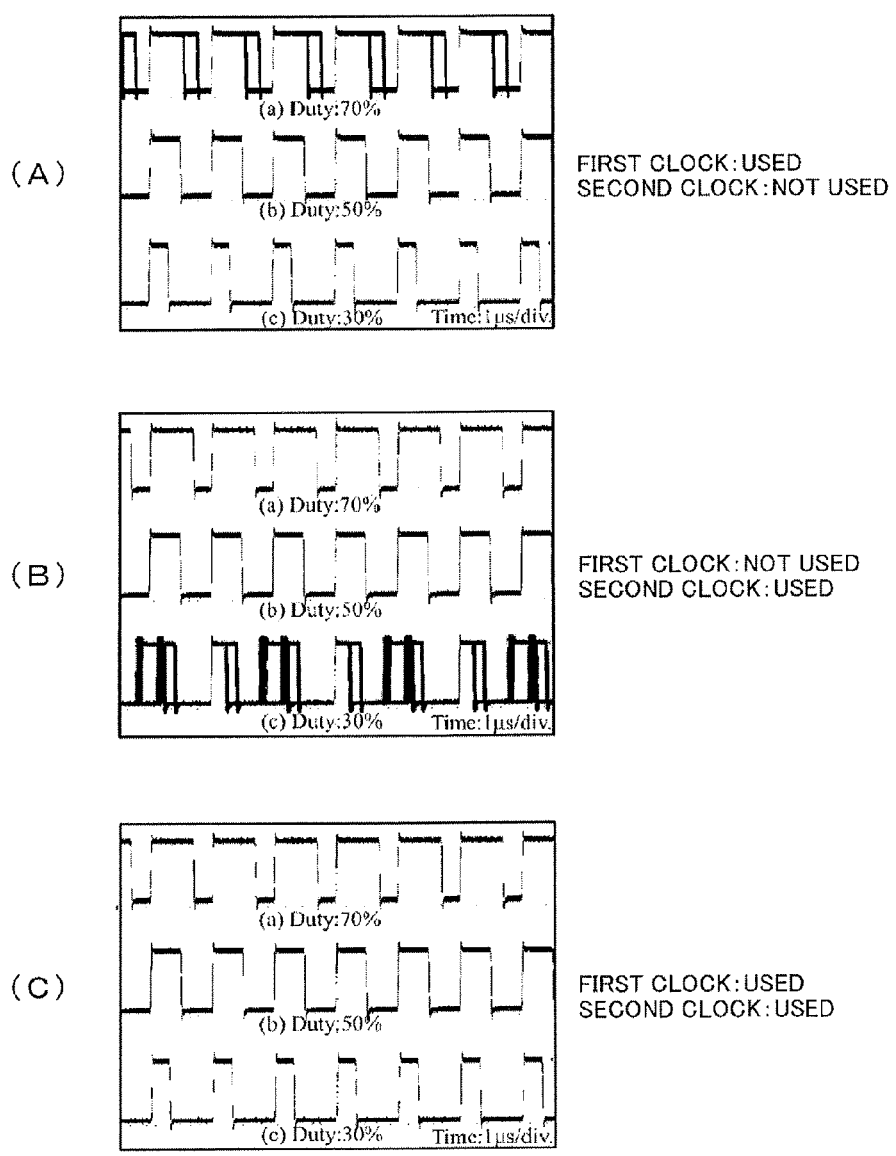
FIG. 3 provides measured waveform charts of the square-wave voltage (A) where the second clock signal is not used, (B) where the first clock signal is not used, and (C) both of the clock signals are used.

FIG. 3 provides measured waveform charts of the square-wave voltage $V_{PWM}$. In the case where the second clock signal $V_{CL2}$ was fixed at H level, i.e., in the case where the second clock signal $V_{CL2}$ was not used, disturbances of the square-wave voltage $V_{PWM}$ due to subharmonic oscillation were observed under the condition where the duty cycle D=70%, as shown in FIG. 3(A). Moreover, in the case where the first clock signal $V_{CL1}$ was fixed at L level, i.e., in the case where the first clock signal $V_{CL1}$ was not used, disturbances of the square-wave voltage $V_{PWM}$ due to subharmonic oscillation were observed under the condition where the duty cycle D=30%, as shown in FIG. 3(B). On the other hand, in the case where both the first clock signal $V_{CL1}$ and the second clock signal $V_{CL2}$ were used, no disturbances of the square-wave voltage $V_{PWM}$ due to subharmonic oscillation were observed either under the condition where the duty cycle D=30% or under the condition where the duty cycle D=70%, as shown in FIG. 3(C).

As described above, the switching power supply device 1A according to the present embodiment includes the pulse width modulation circuit 3A, whereby subharmonic oscillation does not occur, whether the duty cycle D exceeds 50% or not, and therefore, the switching power supply device 1A can operate stably in synchronization with the first clock signal $V_{CL1}$ or the second clock signal $V_{CL2}$.

Next, the method for determining the cycles T of the first clock signal $V_{CL1}$ and the second clock signal $V_{CL2}$ will be described. To determine the cycle T, it is necessary to initially measure an operating frequency in a free-run mode where neither the first clock signal $V_{CL1}$ nor the second clock signal $V_{CL2}$ is used.

Figure 4:
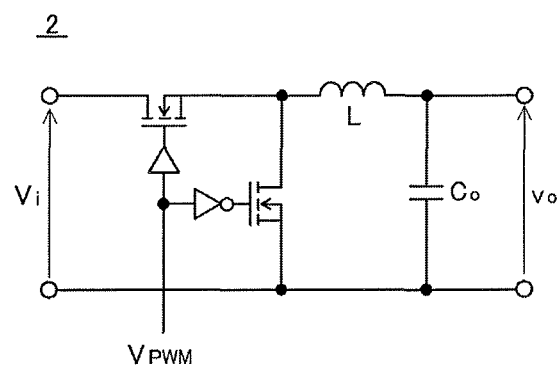
FIG. 4 is a circuit diagram illustrating a specific example of a converter portion provided in the switching power supply device according to the first embodiment.
Figure 5:
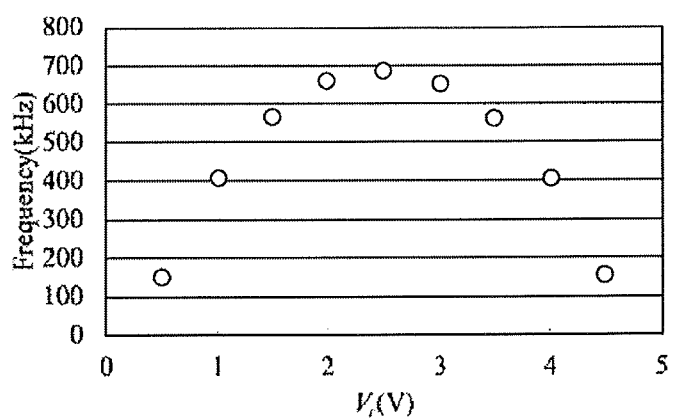
FIG. 5 is a graph illustrating a specific example of an operating frequency where the switching power supply device according to the first embodiment is in a free-run mode.

In the case where a general step-down DC-DC converter as shown in FIG. 4 was used as the converter portion 2, and the circuit constants were set as shown below, when the target voltage $V_r$ was changed in the range of from 0.5V to 4.5V, the operating frequency peaked at 680 kHz where the target voltage $V_r$=2.5V, as shown in FIG. 5.

Circuit Constants $V_i$: 5V, $V_r$: 0.5V to 4.5V
$R_1$: 12 kΩ, $R_2$: 10 kΩ, $R_3$: 1 kΩ
$R_a$: 1 kΩ, $R_b$: 100 kΩ, $C_1$: 470 pF
$C_2$: 1000 pF, $C_3$: 2200 pF
L: 0.47 µH, $C_0$: 500 µF For the switching power supply device 1A according to the present embodiment, it is necessary to set the cycles T such that the frequencies F of the first clock signal $V_{CL1}$ and the second clock signal $V_{CL2}$ are higher than a peak value. If the frequency F is equal to or less than the peak value, oscillation might occur. In the case where the peak value is 680 kHz, the cycles T of the first clock signal $V_{CL1}$ and the second clock signal $V_{CL2}$ need to be set less than 1/680 k, i.e., 1.47 µs.

As will be described later, there are diverse embodiments and variants of the present invention, and in any of them, as in the first embodiment, the cycles T of the first clock signal $V_{CL1}$ and the second clock signal $V_{CL2}$ are determined on the basis of the operating frequency in the free-run mode.

Variants of the First Embodiment

Figure 6:
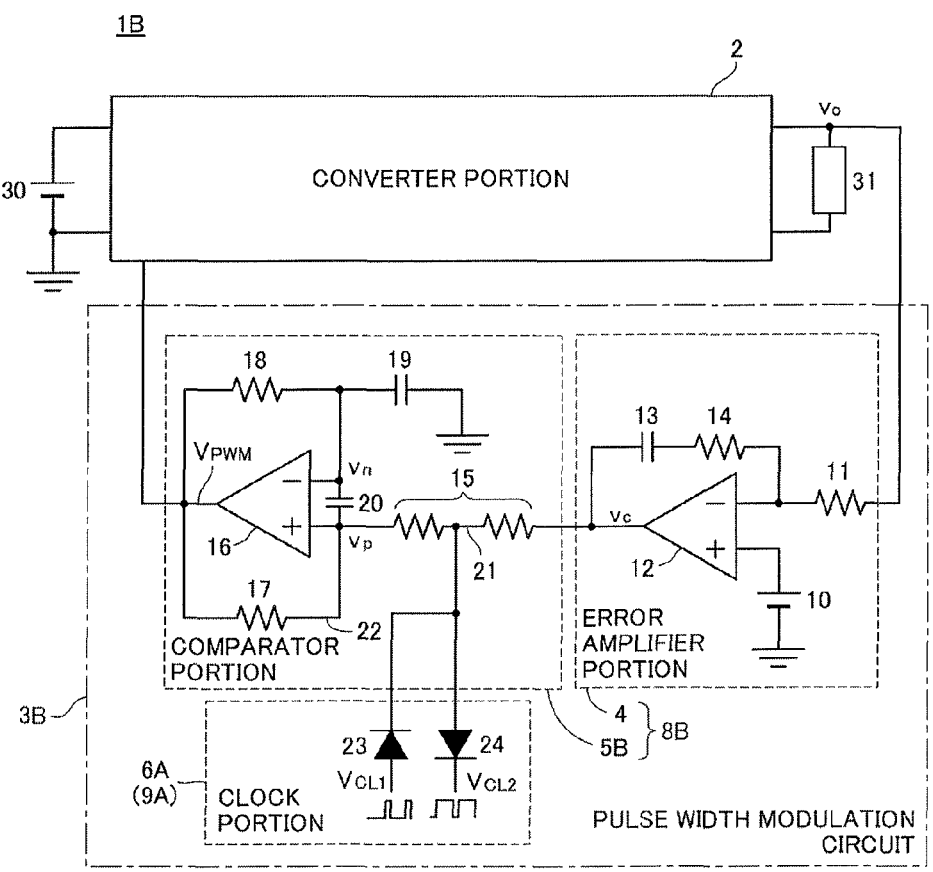
FIG. 6 is a circuit diagram illustrating a variant of the switching power supply device according to the first embodiment.

FIG. 6 illustrates a switching power supply device 1B according to a variant of the first embodiment. The switching power supply device 1B differs from the switching power supply device 1A in that a pulse width modulation circuit 3B, including a comparator portion 5B, is provided, but other features are the same as those of the switching power supply device 1A.

As shown in the figure, in this variant, the comparator portion 5B includes a first resistor 15 consisting of two portions, and the first diode 23 and the second diode 24 of the clock portion 6A are connected to the midpoint of the first resistor 15. More specifically, in the present variant, the first clock signal $V_{CL1}$ and the second clock signal $V_{CL2}$ are inputted to the positive input terminal of the comparator 16 via one of the portions of the first resistor 15.

Figure 7:
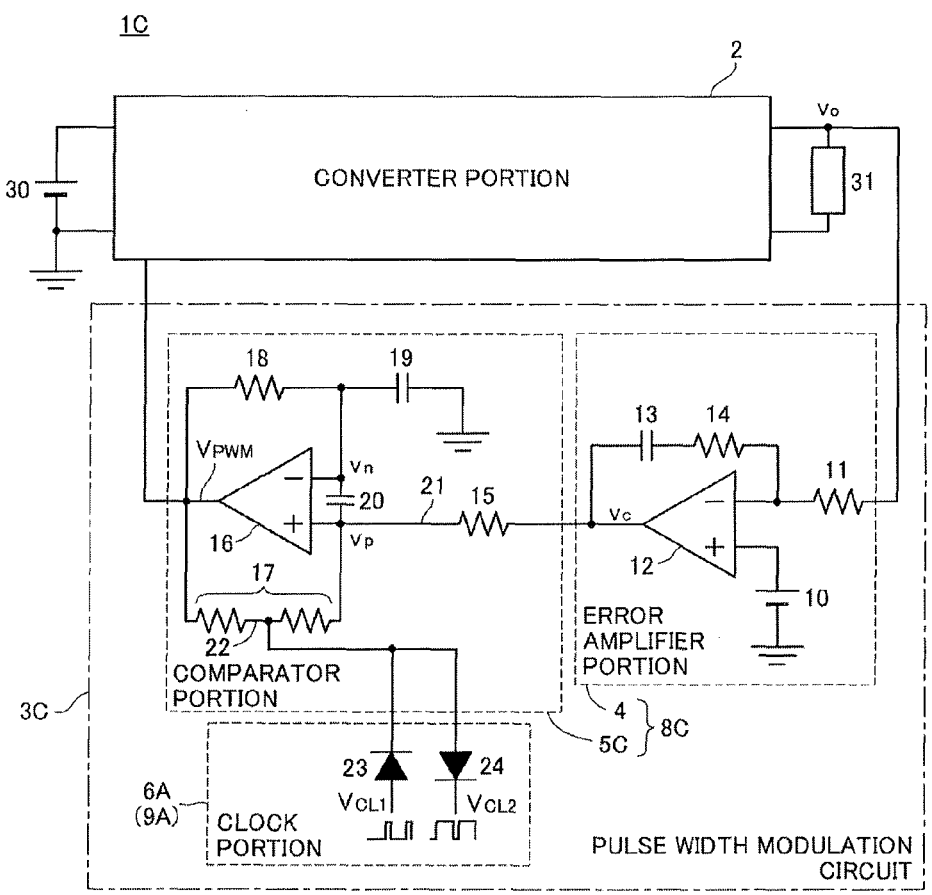
FIG. 7 is a circuit diagram illustrating a variant of the switching power supply device according to the first embodiment.

FIG. 7 illustrates a switching power supply device 1C according to another variant of the first embodiment. The switching power supply device 1C differs from the switching power supply device 1A in that a pulse width modulation circuit 3C, including a comparator portion 5C, is provided, but other features are the same as those of the switching power supply device 1A.

As shown in the figure, in this variant, the comparator portion 5C includes a second resistor 17 consisting of two portions, and the first diode 23 and the second diode 24 of the clock portion 6A are connected to the midpoint of the second resistor 17. More specifically, in the present variant, the first clock signal $V_{CL1}$ and the second clock signal $V_{CL2}$ are inputted to the positive input terminal of the comparator 16 via one of the portions of the second resistor 17.

In the switching power supply devices 1B and 1C according to these two variants, as in the switching power supply device 1A, when the square-wave voltage $V_{PWM}$ is at L level, i.e., when the voltage $v_p$ at the positive input terminal of the comparator 16 is at L level, once the first clock signal $V_{CL1}$ rises to H level, the voltage $v_p$ is forcibly raised to H level, so that the square-wave voltage $V_{PWM}$ is raised to H level as well. On the other hand, when the square-wave voltage $V_{PWM}$ is at H level, i.e., when the voltage $v_p$ is at H level, once the second clock signal $V_{CL2}$ falls to L level, the voltage $v_p$ is forcibly lowered to L level, so that the square-wave voltage $V_{PWM}$ is lowered to L level as well.

That is, in the switching power supply devices 1B and 1C according to the variants, as in the switching power supply device 1A, subharmonic oscillation does not occur, whether the duty cycle D exceeds 50% or not, and therefore, the switching power supply devices 1B and 1C can operate stably in synchronization with the clock signals.

There are diverse other variants of the switching power supply device 1A according to the first embodiment. For example, the positions to which the first clock signal $V_{CL1}$ and the second clock signal $V_{CL2}$ are inputted can be changed appropriately to arbitrary positions along a line 21 with the first resistor 15 disposed thereon (the line connecting the error amplifier portion 4 and the positive input terminal of the comparator 16) or a line 22 with the second resistor 17 disposed thereon (the line connecting the output terminal and the positive input terminal of the comparator 16).

Second Embodiment

Next, a switching power supply device and a pulse width modulation circuit according to a second embodiment of the present invention will be described with reference to FIGS. 8 and 9.

Figure 8:
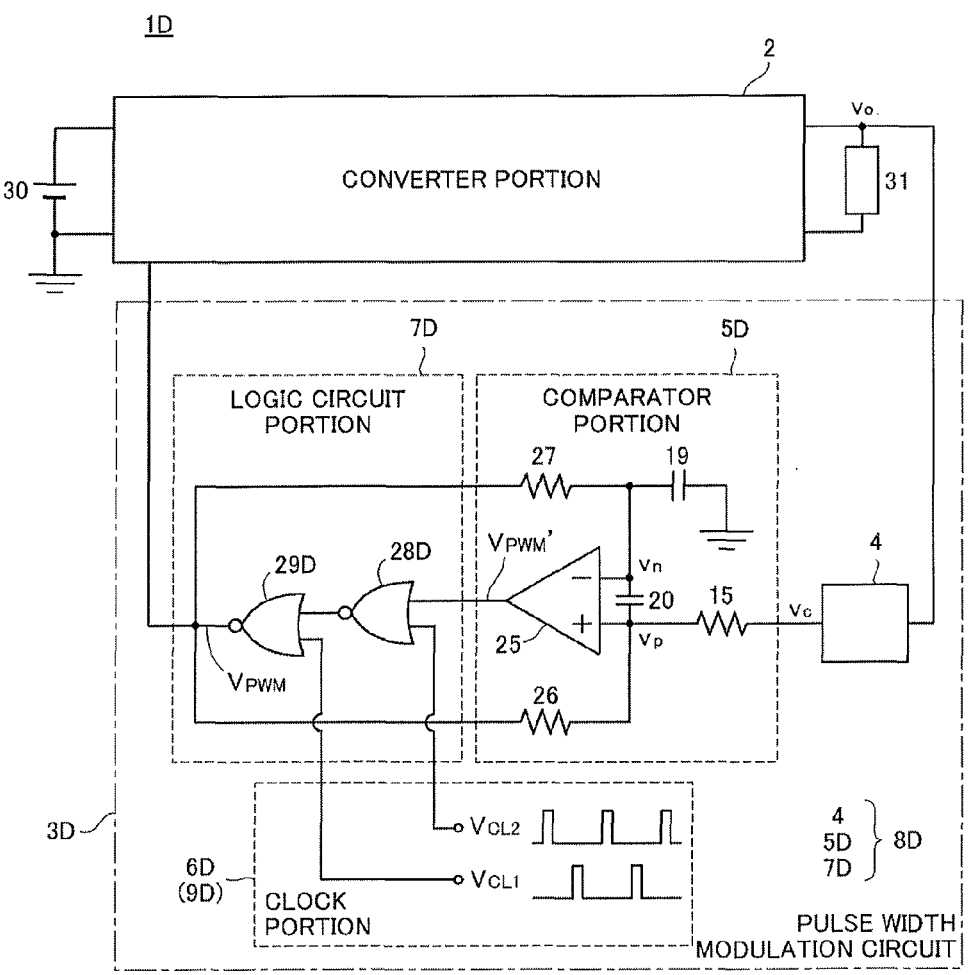
FIG. 8 is a circuit diagram of a switching power supply device according to a second embodiment of the present invention.

In the switching power supply device 1D according to the second embodiment of the present invention, as shown in FIG. 8, a converter portion 2 steps down an input voltage $V_i$ outputted by a direct-current power supply 30 and outputs an output voltage $v_o$, which is equal to a preset target voltage $V_r$, to a load 31, and in addition to the converter portion 2, the switching power supply device 1D includes a pulse width modulation circuit 3D for generating a square-wave voltage $V_{PWM}$ to drive switching elements included in the converter portion 2.

In addition to an error amplifier portion 4, a comparator portion 5D, and a clock portion 6D, the pulse width modulation circuit 3D according to the present embodiment further includes a logic circuit portion 7D. Among them, the error amplifier portion 4, the comparator portion 5D, and the logic circuit portion 7D correspond to the "square-wave voltage output means" 8D of the present invention. Moreover, the clock portion 6D corresponds to the "clock means" 9D of the present invention.

The error amplifier portion 4 has the same configuration as in the switching power supply device 1A according to the first embodiment.

The comparator portion 5D generates a square-wave voltage $V_{PWM}'$ a on the basis of an error voltage $v_c$ outputted by the error amplifier portion 4, and outputs the square-wave voltage $V_{PWM}'$ to the logic circuit portion 7D, and the comparator portion 5D has a comparator 25 with hysteresis as a main component. The comparator 25 includes a positive input terminal (+) connected to the error amplifier portion 4 via the first resistor 15, an output terminal from which the square-wave voltage $V_{PWM}'$ is outputted, and a negative input terminal (−) connected to the midpoint of an integrating circuit consisting of a resistor 27, which is connected to an output of the logic circuit portion 7D, and a capacitor 19. Moreover, the output of the logic circuit portion 7D (a second logical operation portion 29D to be described later) and a positive input terminal of the comparator 25 are connected via a third resistor 26, and a capacitor 20 is connected between the positive input terminal and the negative input terminal of the comparator 25.

The integrating circuit consisting of the resistor 27 and the capacitor 19 integrates a square-wave voltage $V_{PWM}$ outputted by the logic circuit portion 7D, thereby generating an integrated voltage $v_n$ in a triangular waveform. The generated integrated voltage $v_n$ is inputted to the negative input terminal of the comparator 25.

The comparator 25 compares the voltage (integrated voltage $v_n$) at the negative input terminal and the voltage $v_p$ at the positive input terminal, and outputs an H-level square-wave voltage $V_{PWM}'$ having a voltage value $V_{OH}$ when the voltage $v_p$ is higher. On the other hand, when the voltage $v_p$ is lower, the comparator 25 outputs an L-level square-wave voltage $V_{PWM}'$ having a voltage value $V_{OL}$.

The clock portion 6D outputs a first clock signal $V_{CL1}$ and a second clock signal $V_{CL2}$ generated by an unillustrated clock signal generator. Both the first clock signal $V_{CL1}$ and the second clock signal $V_{CL2}$ become H level in cycles T. Moreover, the first clock signal $V_{CL1}$ and the second clock signal $V_{CL2}$ are 180° out of phase from each other. The durations in which the first clock signal $V_{CL1}$ and the second clock signal $V_{CL2}$ are at H level can be set arbitrarily, but it is preferable that they be sufficiently shorter than the cycle T.

The logic circuit portion 7D includes a first logical operation portion 28D and a second logical operation portion 29D connected in a series. In the present embodiment, both the first logical operation portion 28D and the second logical operation portion 29D are dual-input NOR circuits.

The square-wave voltage $V_{PWM}'$ outputted from the output terminal of the comparator 25 is inputted to one input of the first logical operation portion 28D. The second clock signal $V_{CL2}$ outputted by the clock portion 6D is inputted to the other input of the first logical operation portion 28D. Moreover, the first logical operation portion 28D outputs a signal from its output such that the signal is at H level when both the square-wave voltage $V_{PWM}'$ and the second clock signal $V_{CL2}$ are at L level, and in all other cases, the signal is at L level.

The signal outputted by the first logical operation portion 28D is inputted to one input of the second logical operation portion 29D. The first clock signal $V_{CL1}$ outputted by the clock portion 6D is inputted to the other input of the second logical operation portion 29D. Moreover, the square-wave voltage $V_{PWM}$ to be directed to the converter portion 2 is outputted from an output of the second logical operation portion 29D. The square-wave voltage $V_{PWM}$ is at H level when both the signal outputted by the first logical operation portion 28D and the first clock signal $V_{CL1}$ are at L level, and in all other cases, the signal is at L level.

In the switching power supply device 1D according to the present embodiment, as in the switching power supply device 1A according to the first embodiment, when the first clock signal $V_{CL1}$ changes (in the present embodiment, to H level) while the integrated voltage $V_n$ is dropping, the square-wave voltage $V_{PWM}$ shifts to H level even if the integrated voltage $V_n$ has not yet reached the lower threshold voltage, or when the second clock signal $V_{CL2}$ changes (in the present embodiment, to H level) while the integrated voltage $V_n$ is rising, the square-wave voltage $V_{PWM}$ shifts to L level even if the integrated voltage $V_n$ has not yet reached the upper threshold voltage.

That is, the switching power supply device 1D according to the present embodiment includes the pulse width modulation circuit 3D, whereby subharmonic oscillation does not occur, whether the duty cycle D exceeds 50% or not, and therefore, the switching power supply device 1D can operate stably in synchronization with the first clock signal $V_{CL1}$ or the second clock signal $V_{CL2}$.

Variants of the Second Embodiment

Figure 9:
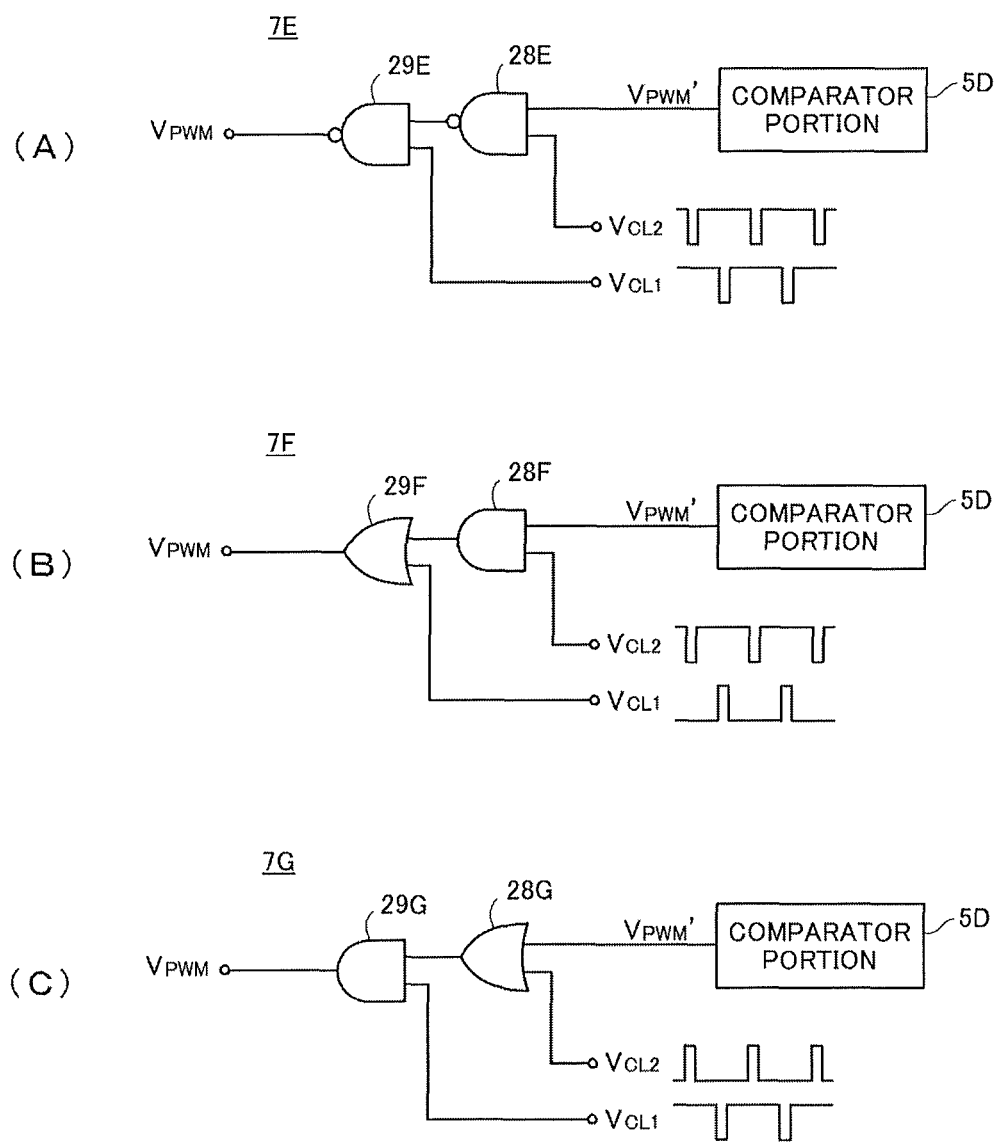
FIG. 9 provides circuit diagrams illustrating variants of a logic circuit portion provided in the switching power supply device according to the second embodiment.

The switching power supply device 1D (the pulse width modulation circuit 3D) according to the second embodiment may include a logic circuit portion 7E, 7F, or 7G shown in FIG. 9, in place of the logic circuit portion 7D.

FIG. 9(A) illustrates a case where a first logical operation portion 28E and a second logical operation portion 29E are dual-input NAND circuits. In this case, a first clock signal $V_{CL1}$ and a second clock signal $V_{CL2}$, which become L level in cycles T, are used, whereby square-wave voltages $V_{PWM}$ in synchronization with the first clock signal $V_{CL1}$ and the second clock signal $V_{CL2}$ are obtained.

FIG. 9(B) illustrates a case where a first logical operation portion 28F is a dual-input AND circuit, and a second logical operation portion 29F is a dual-input OR circuit. In this case, a first clock signal $V_{CL1}$, which becomes H level in cycles T, and a second clock signal $V_{CL2}$, which becomes L level in cycles T, are used, whereby square-wave voltages $V_{PWM}$ in synchronization with the first clock signal $V_{CL1}$ and the second clock signal $V_{CL2}$ are obtained.

FIG. 9(C) illustrates a case where a first logical operation portion 28G is a dual-input OR circuit, and a second logical operation portion 29G is a dual-input AND circuit. In this case, a first clock signal $V_{CL1}$, which becomes L level in cycles T, and a second clock signal $V_{CL2}$, which becomes H level in cycles T, are used, whereby square-wave voltages $V_{PWM}$ in synchronization with the first clock signal $V_{CL1}$ and the second clock signal $V_{CL2}$ are obtained.

Multiphase Power Supply Equipment

Figure 10:
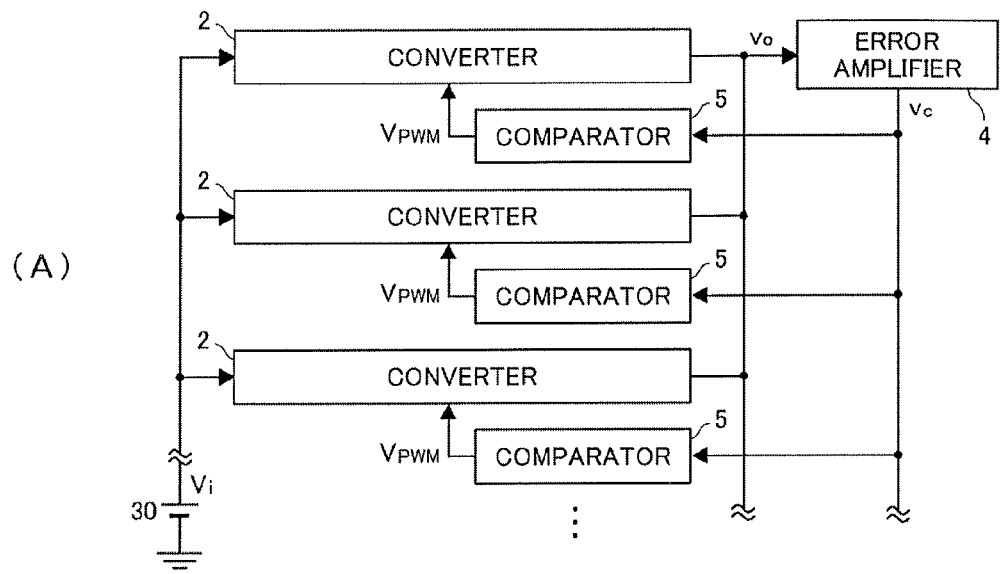
FIG. 10 provides block diagrams of multiphase power supply equipment (A) where a plurality of switching power supply devices according to the first embodiment are connected in parallel, and (B) a plurality of switching power supply devices according to the second embodiment are connected in parallel.
Figure 10:
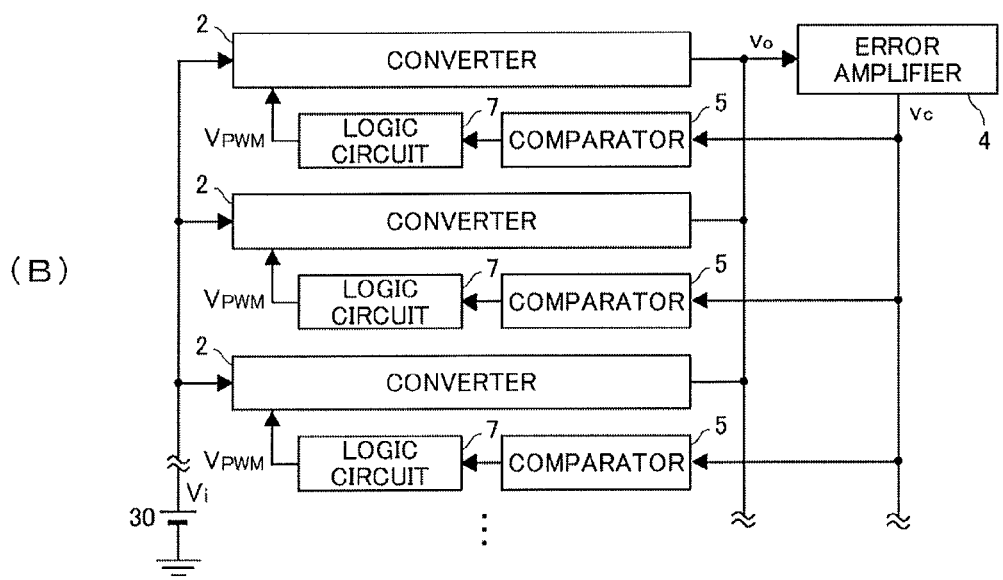
Figure 11:
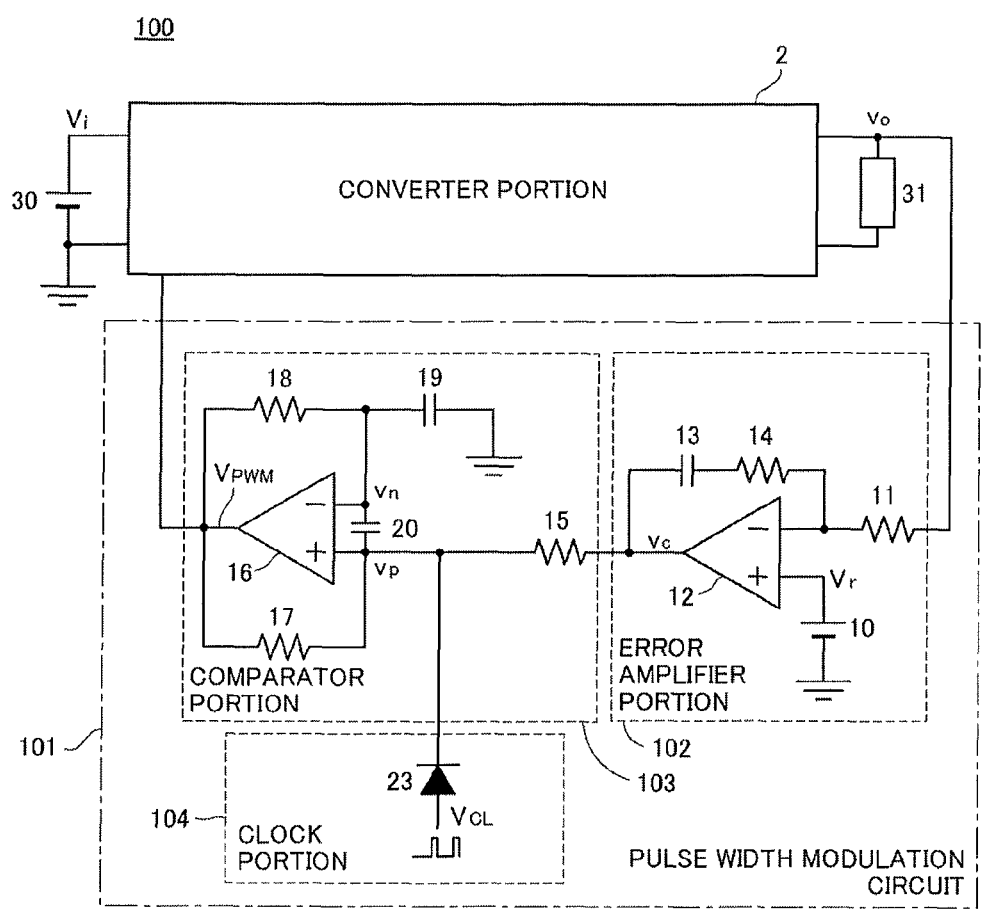
FIG. 11 is a circuit diagram of a conventional switching power supply device.
Figure 12:
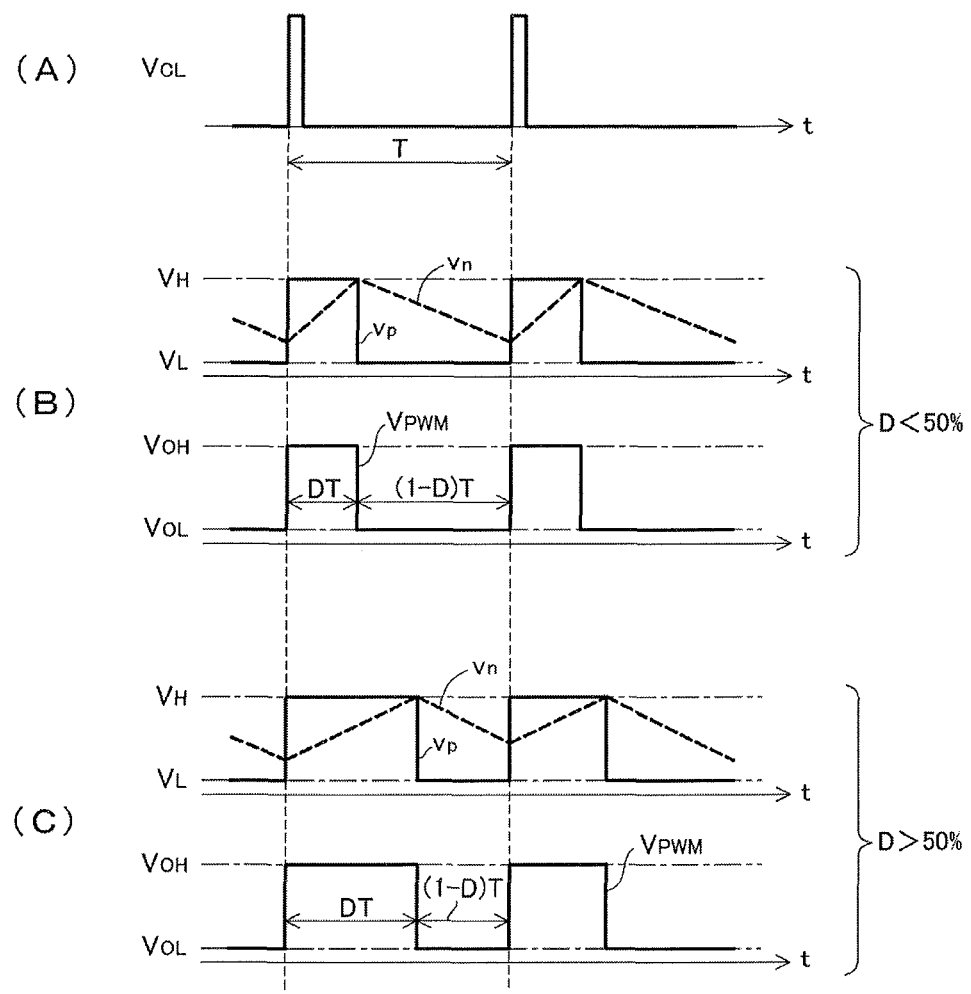
FIG. 12 provides operating waveform charts of the conventional switching power supply device for (A) a clock signal, (B) a square-wave voltage where the duty cycle is below 50%, and (C) the square-wave voltage where the duty cycle exceeds 50%.

Next, multiphase power supply equipment will be described with reference to FIG. 10. Note that the clock portion 6 is not shown in FIG. 10.

FIG. 10(A) illustrates multiphase power supply equipment including a plurality of switching power supply devices according to the first embodiment. In this power equipment, an input voltage $V_i$ outputted by a direct-current power supply 30 is inputted to each converter portion 2, and an output voltage $v_o$ is outputted from one output shared among the converter portions 2. Moreover, an error amplifier portion 4 outputs an error voltage $v_c$ generated on the basis of the output voltage $v_o$, to each comparator portion 5, and the comparator portion 5 outputs a square-wave voltage $V_{PWM}$ in synchronization with a clock signal, to its corresponding converter portion 2.

FIG. 10(B) illustrates multiphase power supply equipment including a plurality of switching power supply devices according to the second embodiment. In this power supply equipment, a logic circuit portion 7 is connected as a subsequent stage to each comparator portion 5, and the logic circuit portion 7 outputs a square-wave voltage $V_{PWM}$ in synchronization with a clock signal, to its corresponding converter portion 2.

While the embodiments and the variants of the switching power supply device and the pulse width modulation circuit according to the present invention have been described above, the present invention is not limited to the configurations described above.

More specifically, in the present invention, a pulse width modulation circuit includes square-wave voltage output means for shifting a square-wave voltage $V_{PWM}$ to L level when an integrated voltage $V_n$ obtained by integrating the square-wave voltage $V_{PWM}$ rises to an upper threshold voltage or more, or shifting the square-wave voltage $V_{PWM}$ to H level when the integrated voltage $V_n$ drops to a lower threshold voltage or less, and clock means for outputting a first clock signal $V_{CL1}$ and a second clock signal $V_{CL2}$, which are 180° out of phase from each other, to the square-wave voltage output means, and the square-wave voltage output means is configured so as to: (1) when the first clock signal $V_{CL1}$ changes while the integrated voltage $V_n$ is dropping, shift the square-wave voltage $V_{PWM}$ to H level even if the integrated voltage $V_n$ has not yet reached the lower threshold voltage; and (2) when the second clock signal $V_{CL2}$ changes while the integrated voltage $V_n$ is rising, shift the square-wave voltage $V_{PWM}$ to L level even if the integrated voltage $V_n$ has not yet reached the upper threshold voltage; the specific circuit configurations for the above are not limited by the embodiments and the variants.

DESCRIPTION OF THE REFERENCE CHARACTERS 1 switching power supply device
2 converter portion
3 pulse width modulation circuit
4 error amplifier portion
5 comparator portion
6 clock portion
7 logic circuit portion
8 square-wave voltage output means
9 clock means
12 operational amplifier
15 first resistor
16 comparator
17 second resistor
23 first diode
24 second diode
25 comparator
26 third resistor 28 first logical operation portion
29 second logical operation portion
30 direct-current power supply
31 load
$V_i$ input voltage
$v_o$ output voltage
$V_r$ target voltage
$v_c$ error voltage
$v_p$ voltage at positive input terminal
$v_n$ integrated voltage
$V_{PWM}$ square-wave voltage
$V_{CL1}$ first clock signal
$V_{CL2}$ second clock signal

The invention claimed is:

1. A pulse width modulation circuit for generating a square-wave voltage taking two states at L and H levels to drive switching elements included in a converter portion, the circuit comprising:
    square-wave voltage output means for shifting the square-wave voltage to L level when an integrated voltage obtained by integrating the square-wave voltage rises to an upper threshold voltage or more, or shifting the square-wave voltage to H level when the integrated voltage falls to a lower threshold voltage or less; and
    clock means for outputting a first clock signal and a second clock signal to the square-wave voltage output means, the first clock signal and the second clock signal being 180° out of phase from each other, wherein,
    the square-wave voltage output means is adapted to: (1) when the first clock signal changes while the integrated voltage is dropping, shift the square-wave voltage to H level even if the integrated voltage has not yet reached the lower threshold voltage; and (2) when the second clock signal changes while the integrated voltage is rising, shift the square-wave voltage to L level even if the integrated voltage has not yet reached the upper threshold voltage.

2. The pulse width modulation circuit according to claim 1, wherein the square-wave voltage output means includes:
    an error amplifier portion for outputting an error voltage between a preset target voltage and an output voltage of the converter portion; and
    a comparator portion including a comparator with a positive input terminal to which the error voltage is inputted via a first resistor and a negative input terminal to which the integrated voltage obtained by integrating the square-wave voltage outputted from its output terminal is inputted, the output terminal being connected to the positive input terminal via a second resistor.

3. The pulse width modulation circuit according to claim 2, wherein the clock means includes:
    a first diode having an anode to which the first clock signal is applied and a cathode connected to a line on which the first resistor is disposed; and
    a second diode having a cathode to which the second clock signal is applied and an anode connected to the line on which the first resistor is disposed.

4. The pulse width modulation circuit according to claim 2, wherein the clock means includes:
    a first diode having an anode to which the first clock signal is applied and a cathode connected to a line on which the second resistor is disposed; and
    a second diode having a cathode to which the second clock signal is applied and an anode connected to the line on which the second resistor is disposed.

5. The pulse width modulation circuit according to claim 1, wherein the square-wave voltage output means includes:

an error amplifier portion for outputting an error voltage between a preset target voltage and an output voltage of the converter portion;

a logic circuit portion for outputting the square-wave voltage; and a comparator portion including a comparator with an output terminal connected to an input of the logic circuit portion, a positive input terminal to which the error voltage is inputted via a third resistor, and a negative input terminal to which the integrated voltage obtained by integrating the square-wave voltage is inputted, the square-wave voltage being inputted to the positive input terminal via a fourth resistor.

6. The pulse width modulation circuit according to claim 5, wherein, the logic circuit portion includes first and second logical operation portions of a dual-input type, the first logical operation portion receives an output from the comparator portion and one of the first and second clock signals, the second logical operation portion receives an output from the first logical operation portion and the other of the first and second clock signals, and the second logical operation portion outputs the square-wave voltage.

7. A switching power supply device, wherein switching elements included in a converter portion are driven by a square-wave voltage outputted by a pulse width modulation circuit of claim 1.

* * * * *